US005863211A

United States Patent [19]
Sobotta et al.

[11] Patent Number: 5,863,211
[45] Date of Patent: Jan. 26, 1999

[54] INTER-BOOK-PACKAGE MECHANICAL AND ELECTRICAL CONNECTION SYSTEM

[75] Inventors: Terry Sobotta, Byron; James A. Melville, Rochester, both of Minn.

[73] Assignee: International Business Machines Corporation, Armonk, N.Y.

[21] Appl. No.: 764,243

[22] Filed: Dec. 12, 1996

[51] Int. Cl.$^6$ ....................................................... H05K 7/10
[52] U.S. Cl. ............................ 439/74; 361/735; 439/328
[58] Field of Search ................................ 439/61, 74, 328; 361/684, 686, 788, 803, 733, 740, 735, 744, 785, 790

[56] References Cited

U.S. PATENT DOCUMENTS

| | | |
|---|---|---|
| 2,951,184 | 8/1960 | Wyma . |
| 3,462,540 | 8/1969 | Harris et al. . |
| 3,614,541 | 10/1971 | Farrand . |
| 3,701,078 | 10/1972 | Lynch . |
| 4,490,000 | 12/1984 | Asick et al. . |
| 4,502,098 | 2/1985 | Brown et al. . |
| 4,558,914 | 12/1985 | Prager et al. ............................ 361/686 |
| 4,592,610 | 6/1986 | Bowls . |
| 4,744,006 | 5/1988 | Duffield . |
| 4,811,165 | 3/1989 | Currier et al. ......................... 361/749 |
| 4,818,241 | 4/1989 | Smoot . |
| 4,868,712 | 9/1989 | Woodman . |
| 5,019,945 | 5/1991 | Smolley . |
| 5,211,565 | 5/1993 | Krajewski et al. . |
| 5,219,292 | 6/1993 | Dickirson et al. . |
| 5,379,192 | 1/1995 | Lievin . |
| 5,432,682 | 7/1995 | Giehl et al. . |
| 5,469,335 | 11/1995 | Kluth et al. . |
| 5,479,320 | 12/1995 | Estes et al. . |
| 5,519,571 | 5/1996 | Shieh ...................................... 361/686 |
| 5,544,008 | 8/1996 | Dimmick et al. . |

OTHER PUBLICATIONS

"Sheet Metal Aluminum Generic Book," Feenstra and Sobotta et al., *IBM Technical Disclosure*, vol. 33, No. 10B, Mar. 1991, pp. 193–199.

*Primary Examiner*—Neil Abrams
*Attorney, Agent, or Firm*—Michael K. Mutter; Birch, Stewart, Kolasch & Birch

[57] ABSTRACT

An interconnected book-package system permitting the circuit boards within book packages to communicate exclusively of the backplane (e.g., 300). This permits a circuit board that would otherwise have to be constructed from a larger than standard size circuit board and housed within a larger than standard size book package to be formed out of two standard size or smaller circuit boards housed within standard size book package assemblies. This is especially useful to customers seeking upgrade flexibility. The book packages of the interconnected system are connected mechanically and electrically exclusively of the backplane by a connection assembly (e.g., 502, 414, 504, 416) that makes it possible to blindly plug the book packages together. Multi-book latch assemblies include a clip (e.g., 702 and/or 704) used to interconnect the latches on a pair of book packages so that the connected books can be plugged into the backplane as a unit. An electrically conducted gasket is positioned between two connected book packages and around the connection assembly to provide ESD and EMI protection for the interconnected circuit boards. A floating backplane connector relieves the build up of tolerance between book packages of the same pitch and permits such book packages that have been connected together to be connected to a backplane having a difference pitch. Resilient clips (e.g., 500) are also used to join adjacent book packages.

37 Claims, 21 Drawing Sheets

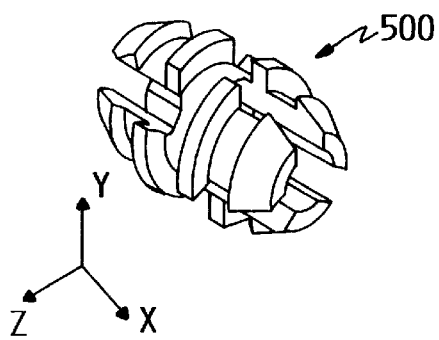
FIGURE 7A
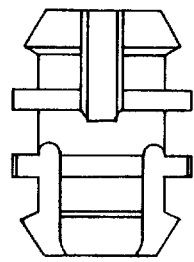
FIGURE 7B
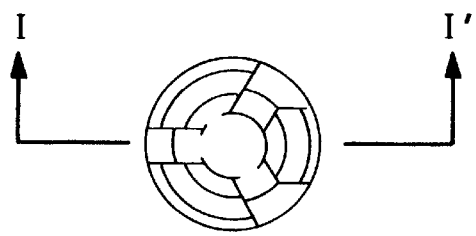
FIGURE 7C
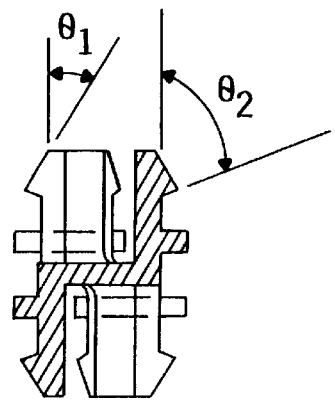
FIGURE 7D (I-I')
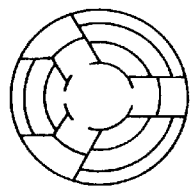
FIGURE 7E

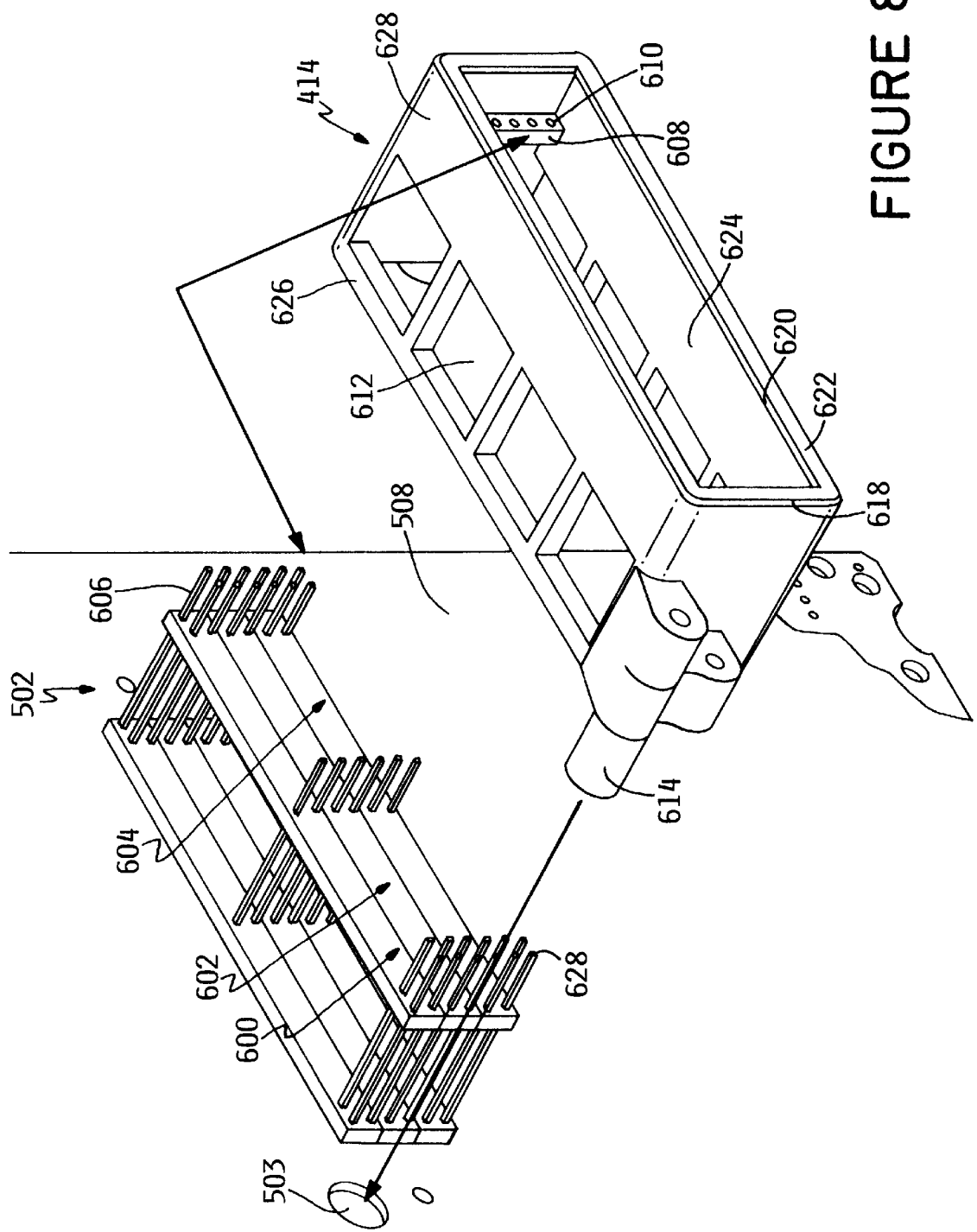

INTER-BOOK-PACKAGE MECHANICAL AND ELECTRICAL CONNECTION SYSTEM

The present invention is directed toward a system for mechanically connecting a first book package to a second book package and electrically connecting the first book package to the second book package exclusive of the backplane. The present invention relates, generally, to data processing systems, and more particularly to placement of circuit board modules, or book package assemblies (book packages), in data processing systems. The present invention is directed toward a system for mechanically connecting a first book package to a second book package and electrically connecting the first book package to the second book package exclusive of the backplane.

BACKGROUND OF THE INVENTION

Current data processing systems require circuit board packaging systems that are designed to be compact and easy to service and upgrade at the end-user cite. Such compact designs are necessary because they are easily utilized in office environments where the availability of space is limited or special environmental conditions are required by the data processing systems. In addition, data processing systems typically support a number of options, and the end user may wish to add or remove options at any time after an initial installation. It is desirable that the field service representative or an user be able to make these changes in the minimum time possible without the need for special tools.

A common method of achieving the goals of compact design and ease of field service and field upgrades is to employ a modular circuit board design. A common type of modular design provides for a main circuit board, also known as the mother board or backplane. The mother board usually provides, the basic computer circuitry that is essential for operation of the data processing system is located on the mother board. Also, connections to the mother board are provided so that additional circuit boards, known as daughter boards, can be used to provide optional or enhanced functions. An example of a family of computers employing such a modular circuit board design is marketed by the IBM Corporation under the trade name of the AS400 family of computers.

The AS400 family of computers houses daughter boards in packages known as book package assemblies. An example of such a prior art book package is depicted in FIGS. 1 and 2. An expanded view of the book package 100 of FIG. 1 is depicted in FIG. 2. Typically, a single circuit board 102, having connectors 114 and 116 for connection to the backplane, is housed within a structure formed from side coverage 104 and 106 and top and bottom rail assemblies 108 and 110, respectively. Latches 112 are provided to mechanically secure the book package into the chassis associated with the backplane.

The use of book package assemblies confers several benefits. For example, the circuit board housed therein is protected from electrostatic discharge (ESD) during handling by a service person. In addition, the housing structure is usually metallic which confers electromagnetic interference (EMI) shielding for the circuit board 102 housed therein. In addition, the book package 100 is more rugged than the circuit board 102 so that it can withstand the rigors of handling, i.e., those other than ESD, better than the naked circuit board 102 can withstand them.

In FIG. 4, a prior art book package 100 is depicted as plugging into a mother board 300 via a chassis 302. As a modular computer system, e.g., the AS400 family, develops, the manufacturer strives to maintain uniform dimensions for key components such as daughter boards and the chassis. One reason for this is that it minimizes some of the difficulties associated with retrofitting older models in the product line with enhancements and/or new options.

The enhancements and/or options might require circuitry that exceeds the space available on a single daughter card. In such a situation, the circuit has to be split into two separate daughter cards. Some prior art systems require the two parts of this oversize circuit to communicate via the backplane. This is a relatively long signal path that can introduce unacceptable signal propagation delays due to the length of the path. Some prior art systems, for example, U.S. Pat. No. 5,444,008 to Dimmick, Sobotta (one of the Inventors of the present invention) et al., filed Jun. 30, 1994, and issued Aug. 6, 1996, enclosed two daughter boards within a single book package and connected the daughter boards together by an edge connector in addition to the connection via the backplane.

The U.S. Pat. No. 5,544,008 patent provides a much easier access to the daughter boards than other prior art systems that provided plural boards within a single book package. Consequently, if one of the plural boards failed, the U.S. Pat. No. 5,544,008 patent made it much easier for a service person to open the book package, remove the defective board, replace it, and then re-assembly the book package.

Unfortunately, the U.S. Pat. No. 5,544,008 patent still requires a service person to open the book package, which exposes the non-defective board to the risks of handling by the service person, i.e., ESD damage to the electrical components and mechanical damage from the rigors of handling. Moreover, the U.S. Pat. No. 5,544,008 patent suffers from a relatively long path length connecting the first daughter board to the second daughter board because of the requirement of connecting via the edge connector provided in addition to the backplane connections. In addition, the process according to the U.S. Pat. No. 5,544,008 patent by which a defective board in a book package is replaced remains relatively lengthy because of the need to open the book package, unplug the defective board, plug in the replacement board, and re-close the book package, in addition to the steps of removing the book package from the backplane and then re-attaching it to the chassis backplane.

An example of how a prior art latch 112 is attached to the book package 100 is depicted in FIG. 3. In FIG. 3, a latch retainer 204, for example, made of stainless steel, is attached to the side covers 104 and 106. The latch 112 is retained by inserting latch pins 200 integrally formed on the latch 112, into the holes 202 in the retainer 204. A stud 206 is inserted in a coil spring 208 such that an end 210 of the stud 206 engages a flat surface 212 on the stud 206. The spring-biased stud 106 is inserted in the retainer 204 so that the flat surface 212 addresses the D-shaped hole 214 that will be next to the cover plate 216. A small diameter pin-like extension 218 of the stud 206 is inserted into a hole 220 on the cover plate 104 and a tab 222 on the retainer 204 is inserted into a slot 223 in the cover plate 104. The stud 206 is then rivetted to the base cover 106, securing the assembly. These same parts, using a mirror image coil spring 210, are similarly assembled in the other latch position.

The latch assembly of book package 100 differs from that shown in FIG. 3, for example, because the latch retainer 204 is integrally formed from the rails 108 and 110, respectively, and because the stud 206 has two pin-like extensions 218, i.e., no rivet is used to hold the studs 206 in place.

SUMMARY OF THE INVENTION

It is an object of the present invention to provide, generally, a data processing system, especially one relating to the placement of circuit board modules, i.e., book packages, in data processing systems.

It is an object of the present invention to provide an inter-book-package mechanical and electrical connection system.

It is an object of the present invention to provide at least two book packages whose circuit boards are electrically connected exclusively of a backplane and which can be disconnected from each other simply and quickly.

It is an object of the present invention to provide the equivalent of a single circuit board greater in size than the maximum size daughter board that can fit within a standard, e.g., AS400 computer family, by splitting the large circuit board into plural daughter boards, each of which is housed within its own standard size book package, and which communicate with each other via an electrical connection exclusive of the backplane, and preferably made in the form of a connection other than an edge connection.

It is an object of the present invention to provide at least two book packages, the circuit boards of which can be connected to each other exclusively of the backplane by a blind plugging manual operation, i.e., a manual operation in which it is unnecessary for the inter-book-package connectors to be aligned visually.

It is an object of the present invention to provide mechanical and electrical connections such that the circuit boards of at least two book packages can be connected electrically exclusively of the backplane and such that the book packages can be mechanically connected to be manipulable together as a unit by a person installing the book packages into the chassis/backplane of a computer.

It is an object of the present invention to eliminate the medium-grade alignment, necessary to connect at least two book packages together exclusively of the backplane, that would otherwise be provided by the party who wished to connect the two book packages, observing the alignment of non-backplane connectors. The present invention achieves this medium-grade alignment by providing complementarily formed male and female guide structures for use with the non-backplane connectors.

Rugged, easy to assemble/disassemble, and easy to install/remove multi-board daughter circuits, and other objects of the present invention, are achieved by providing an interconnectable book package system for use in a computer having a backplane to which circuit boards housed in book packages are connectable mechanically and electrically, the system comprising: a first book package having a first circuit board therein, the first book package being mechanically connectable to the backplane and the first circuit board being electrically connectable to the backplane; a second book package having a second circuit board therein, the second book package being mechanically connectable to the backplane; and a connection assembly mechanically connecting the first book package to the second book package and electrically connecting the first circuit board to the second circuit board exclusively of the backplane.

Rugged, easy to assemble/disassemble, and easy to install/remove multi-board daughter circuits, and other objects of the present invention, are also achieved by providing an interconnectable book package system for use in a computer having a backplane to which circuit boards housed in book packages are connectable mechanically and electrically, the system comprising: a first book package having a first circuit board therein, the first book package being mechanically connectable to the backplane and the first circuit board being electrically connectable to the backplane; a second book package having a second circuit board therein, the second book package being mechanically connectable to the backplane; first connecting means attached to the first book package and second connecting means attached to the second book package, each connecting means being for mechanically and electrically connecting to the other so as to mechanically connect the first book package to the second book package and electrically connect the first circuit board to the second circuit exclusively of the backplane; and alignment means, formed on one of the first or second connecting means, for aligning the first connecting means with the second connecting means.

Rugged, easy to assemble/disassemble, and easy to install/remove multi-board daughter circuits, and other objects of the invention, are also fulfilled by providing, in a computer system, a method of forming a circuit that would otherwise be too large to be formed on a standard size circuit board housed within a standard size book package, the method comprising the steps of: partitioning the circuit into at least two subcircuits; forming a first one of the subcircuits on a first standard size, or smaller, circuit board; forming a first standard size book package including the first circuit board; forming a second one of the subcircuits on a second standard size, or smaller, circuit board; forming a second standard size book package including the second circuit board; mechanically connecting the first book package to the second book package while electrically connecting the first circuit board to the second circuit board exclusively of the backplane; mechanically connecting both the first and second book packages to the backplane while electrically connecting the first circuit board of the first book package to the backplane.

Easy, non-damage-promoting, assembly of multi-board circuits, and other objects of the present invention, are fulfilled by providing a method of blindly connecting a first book package to a second book package, the first and second book packages having a circuit board housed therein and having an edge surface perpendicular to the plane of the circuit board therein, respectively, the first book package having a first connecting means and the second book package having a second connecting means, each connecting means being for mechanically and electrically connecting to the other so as to mechanically connect the first book package to the second book package and electrically connect the first circuit board to the second circuit exclusively of a backplane of a computer in which the first and second book packages are to be used, the method comprising the steps of: positioning a face of the first book package, on which is disposed the first connecting means, over a face of the second book package on which is disposed the second connecting means; aligning an edge surface contour of the first book package with an edge surface contour of the second book package such that the first connecting means aligns with the second connecting means without having to observe the position of the first connecting means relative to the position of the second connecting means; and inserting one of the first and second connecting means into the other of the first and second connecting means, without having to observe the position of the first connecting means relative to the position of the second connecting means, to mechanically connect the first book package to the second book package while electrically connecting the first book package to the second book package exclusively of the backplane.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein

FIG. 7A is a three-quarter perspective view of an embodiment of the cover clip of the present invention;

FIG. 7B is a top view of the cover clip of FIG. 7A, where the view in FIG. 7A has been rotated approximately 60° about the Z-axis and then approximately 45° about the Y-axis to produce the top view of FIG. 7B;

FIG. 7C is a first end view of the cover clip, with the sectional view line I–I' indicated;

FIG. 7D is a sectional view of the cover clip along the view line I–I';

FIG. 7E is a second end view, opposite to the end depicted in FIG. 7C, of the cover clip;

FIG. 8 is an exploded view of the male part of the connection assembly of the present invention;

DETAILED DESCRIPTION OF THE PREFERRED EMBODIMENTS

Figure 1:
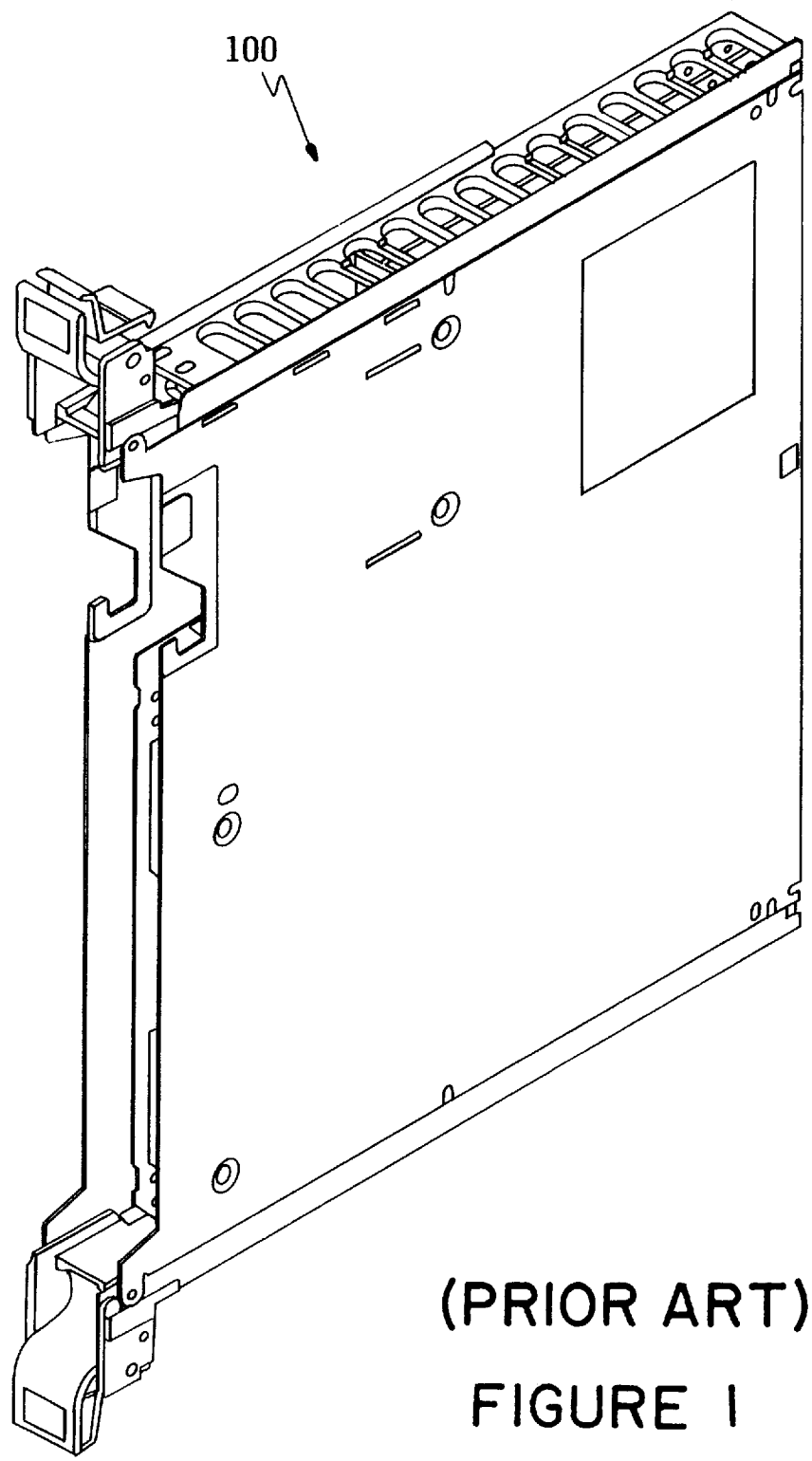
FIG. 1 is a depiction of a prior art book package.
Figure 2:
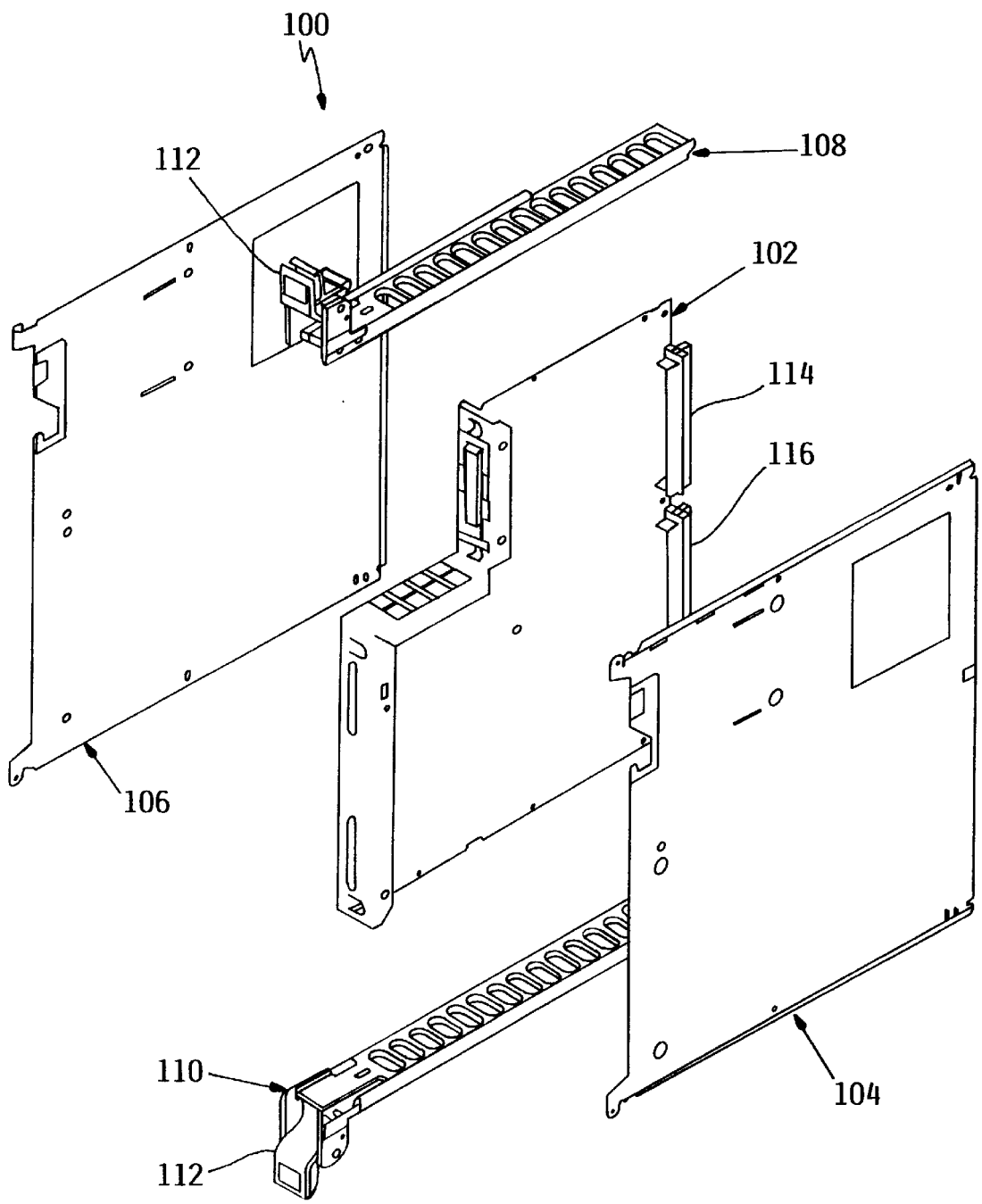
FIG. 2 is an exploded view of the prior art book package of FIG. 1.
Figure 3:
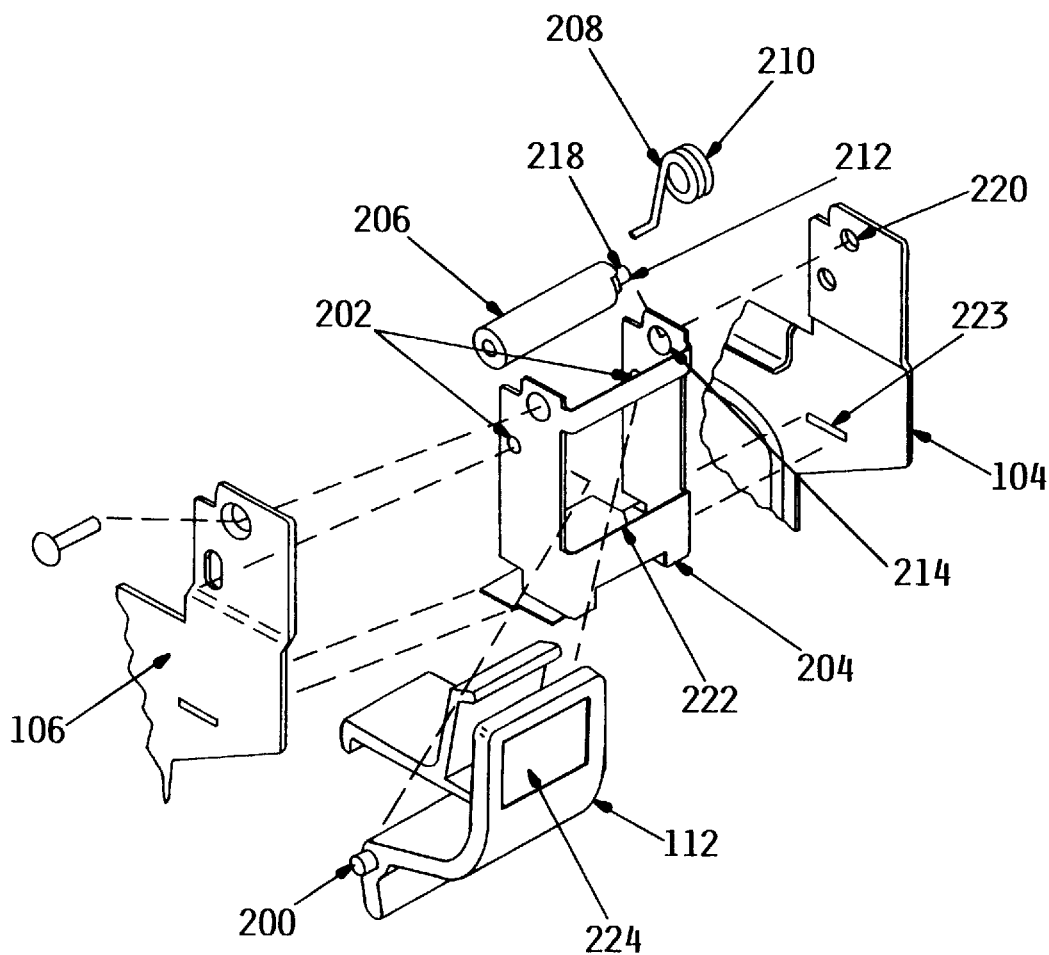
FIG. 3 is an exploded view detailing the connection of a prior art latch to a prior art book package.
Figure 4:
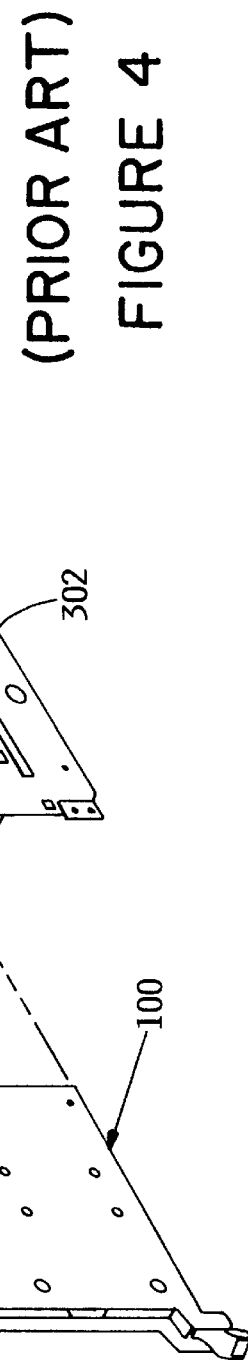
FIG. 4 is an exploded view of a prior art backplane, chassis and book package assembly.
Figure 5:
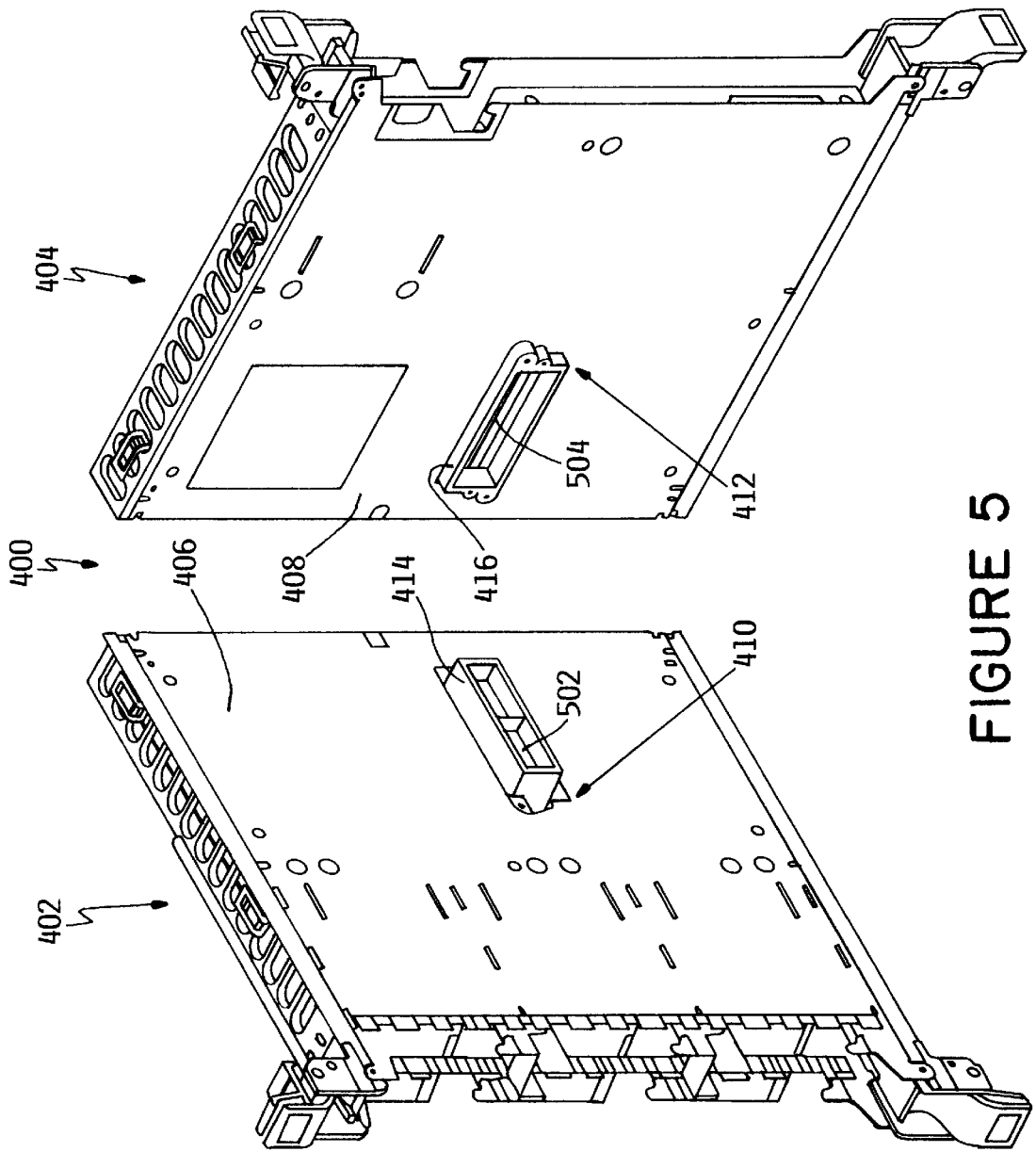
FIG. 5 is a perspective view showing an embodiment of the complimentarily-shaped connection assembly of the present invention that permits two book packages to be connected exclusively of the backplane.

FIG. 5 is a perspective view of an embodiment of the inter-book-package connection assembly of the present invention. The inter-connected book package system 400 includes a first book package 402 and a second book package 404. An inside cover 406 of the book package 402 has an aperture 410 through which extends a male guide structure 414 surrounding a male connector 502. The second book package 404 includes an inner cover plate 408 having an aperture 412 through which extends a female guide structure 416 in which is located a female connector 504.

Figure 6:
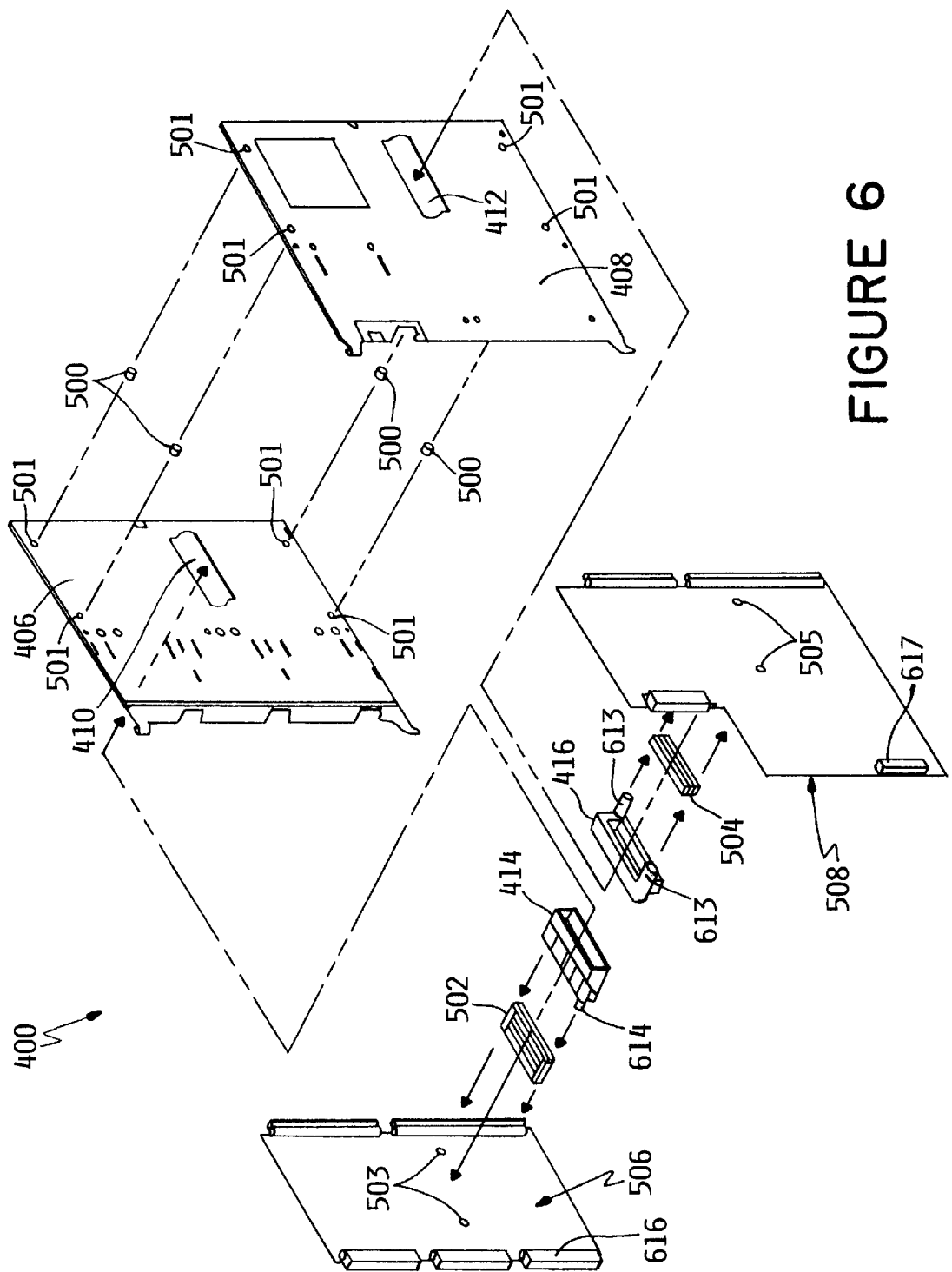
FIG. 6 is an exploded view of the principal components of the connection assembly of the present invention.

FIG. 6 is an exploded view of the principal components of the interconnected book package system 400. A first circuit board 506 (having backplane connectors 616) has a male connector 502 mechanically and electrically attached to it. The male electrical connector 502 is inserted into the male guide structure 414. The male guide structure 414 is mechanically attached to the first circuit board 506 in part by insertion of cylindrical extensions 614 (one of which is shown) into the two holes 503 in the first circuit board 506. The cylindrical extensions 614 are of sufficient length that they extend through the holes 503 and beyond the surface of the first circuit board 506 out to the inner surface of the outside cover (not shown) of the book package 402 such that the cylindrical extensions 614 act as spacers between the outside cover (not shown) of the book package 402 and the first circuit board 503. The guide structure 414 is inserted through the aperture 410 in the inside cover 406 of the book package 402.

A female connector 504 is attached to the second circuit board 508 (having a backplane connector 617) in the second book package 404. The female guide structure 416 is mounted over/around the female connector 504 at least in part by way of the insertion of the cylindrical extensions 613 being inserted through the corresponding holes 504 in the second circuit board 508. As with the cylindrical extensions 614, the cylindrical extensions 613 are of sufficient length that they extend through the holes 505 and beyond the surface of the second circuit board 508 out to the inner surface of the outside cover (not shown) of the book package 404 such that they act as a spacer between the circuit board 508 and the outside cover of the book package 404. The female guide structure is inserted through the aperture 412 in the inner cover plate 408.

As a supplement to the mechanical connection provided by the insertion of the male guide structure 414 into the female guide structure 416, cover clips 500 are provided for insertion into holes 501 in the inner covers 406 and 408.

FIGS. 7A–7E are more detailed depictions of the cover clip 500. The cover clip 500 is a molded, preferably polycarbonate, part having three symmetrical features or fingers per end. One end is rotated 60 degrees, relative to the other along the X-axis of FIG. 7A, to permit the use of a conventional two piece mold with an end slide to core out the internal diameter. The advantage of using this type of mold is that it is an economical technology for producing this part in production quantities.

Having each end of the cover clip depicted in FIGS. 7A–7E be symmetrical, albeit rotated 60 degrees from each other, allows the cover clip 500 to function equally well without regard to part orientation. The three fingers on each end snap into a hole in the cover of a book package. This snap aspect is such that each finger has both a lead-in angle of 56°, where $\theta \approx 28°$ and $2*\theta \approx 56°$, and a removal angle of 134°, where $\theta_2 \approx 67°$ and $2*\theta_2 \approx 134°$. This allows the part to be assembled with a lower insertion force than is required for removal. This provides an easy to assemble procedure that does not require the destruction of the clip for rework and service. The central portion of the clip has two 1 mm thick cylindrical features that support the opposing covers of the book assembly at the specific dimension required for the assembly to plug successfully to the backplane.

FIG. 8 is an enlarged depiction of the male guide structure 414, the male connector 502, and the corresponding portion of the circuit board 506. The male electrical connector 502 is preferably formed from three well-known stick connectors stacked on top of each other. It is noted that only a few of the pins in each connector are depicted in order to simplify the drawing; normally, each stick connector is fully populated with pins, e.g., 50 pins per connector. Thus, the male connector 502 preferably includes three 50 pin stick connectors 600, 602 and 604. Each pin 606 is of sufficient length to extend through the male guide structure 414, the female guide structure 416, and into the female connector 504.

As part of the mechanical connection between the guide structure 414 and the male connector 502, the outer most column of pins on both sides of the stacked stick connectors 600, 602, and 604 are inserted through a flange 608 in the male guide structure 414. Only one of the flanges 608 is depicted in FIG. 8 due to the angle of prospective at which FIG. 8 is drawn. There are holes 610 in the flanges 608 that are sized slightly smaller than the pins 606 such that the insertion of the pins 606 into the holes 610 produces a tight friction fit, i.e., mechanical connection.

Figure 21:
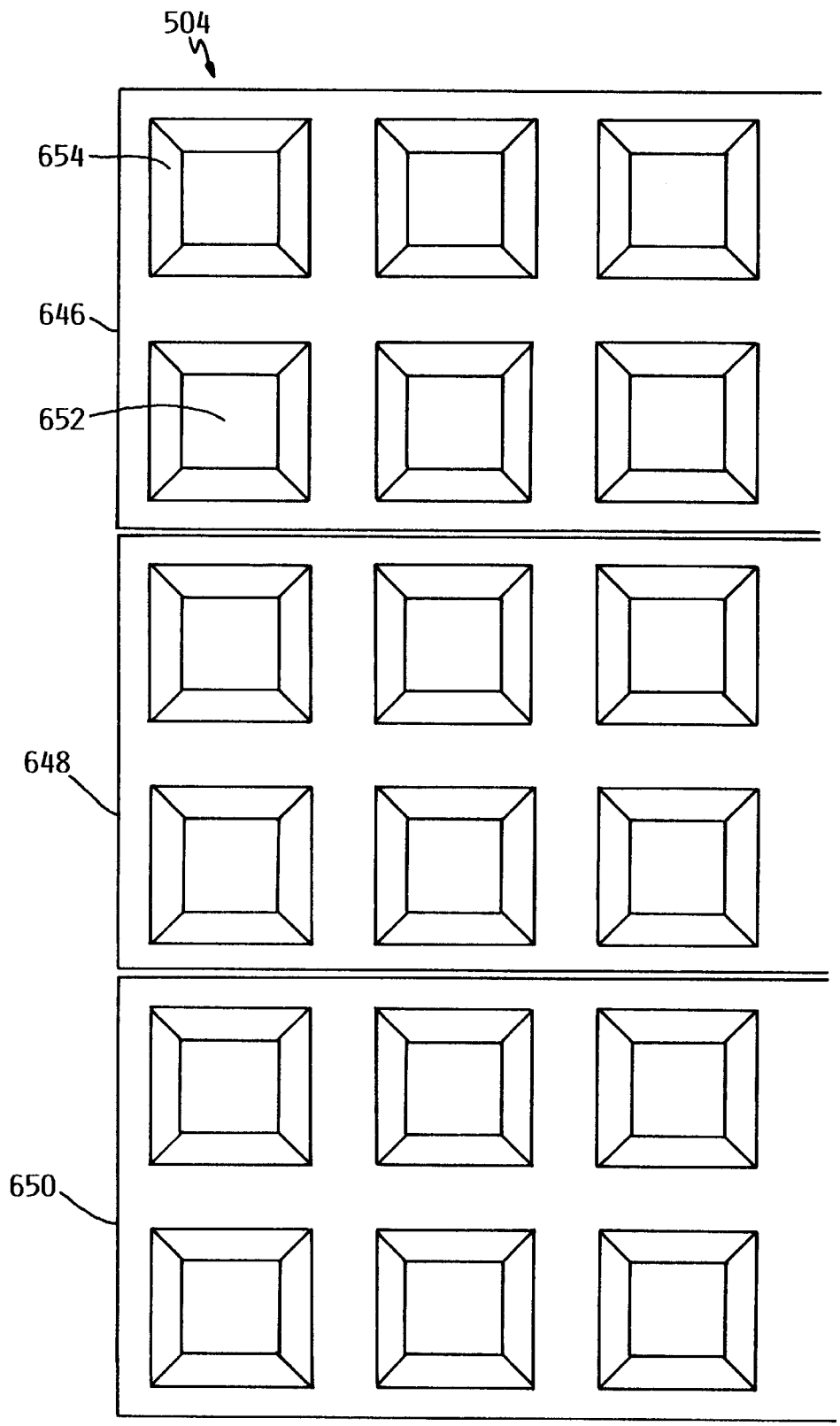
FIG. 21 is a top view of the female connector for use with the inter-book-package connection assembly of the present invention.

The pins 606 of the male connector 502 have tapered ends 628. FIG. 21 depicts a portion of the face of the well known female connector 504. As with the male connector 502, the female connector 504 is formed by stacking the female parts of three well known stick connectors, namely 646, 648, and 650. Each hole 652, corresponding to a pin 606, has a tapered face 654 surrounding the hole 652. The combination of the tapered end 628 of the pin 606 and the tapered face 654 of the hole 652 achieve fine alignment between the male connector 502 and the female connector 504 prior to the pins 606 being inserted into the holes 652. In other words, when a pin 606 is inserted into a hole 652, there is a negligible amount of play, i.e., the pin 606 fits closely in the hole 652. On the other hand, if one considers the tapered surfaces 654 to be the enlarged mouth of the hole 652, there is significantly more play between the pin 606 and the mouth of the hole 652 than when the pin 606 is inserted into the hole 652. Thus, fine alignment is achieved.

Returning to FIG. 8, the most distal surface 622 of the male guide structure 414, relative to the circuit board 508, is tapered both on the inside and the outside. The inside tapered surface 620 and the outside tapered surface 618 contribute to the alignment function achieved by the male guide structure 414, to be discussed further below.

The top and bottom walls 628 and 626, respectively of the guide structure 414 have apertures 612 in them to promote the flow of air across the pins 606 and to reduce the mass of the male guide structure 414.

Figure 9:
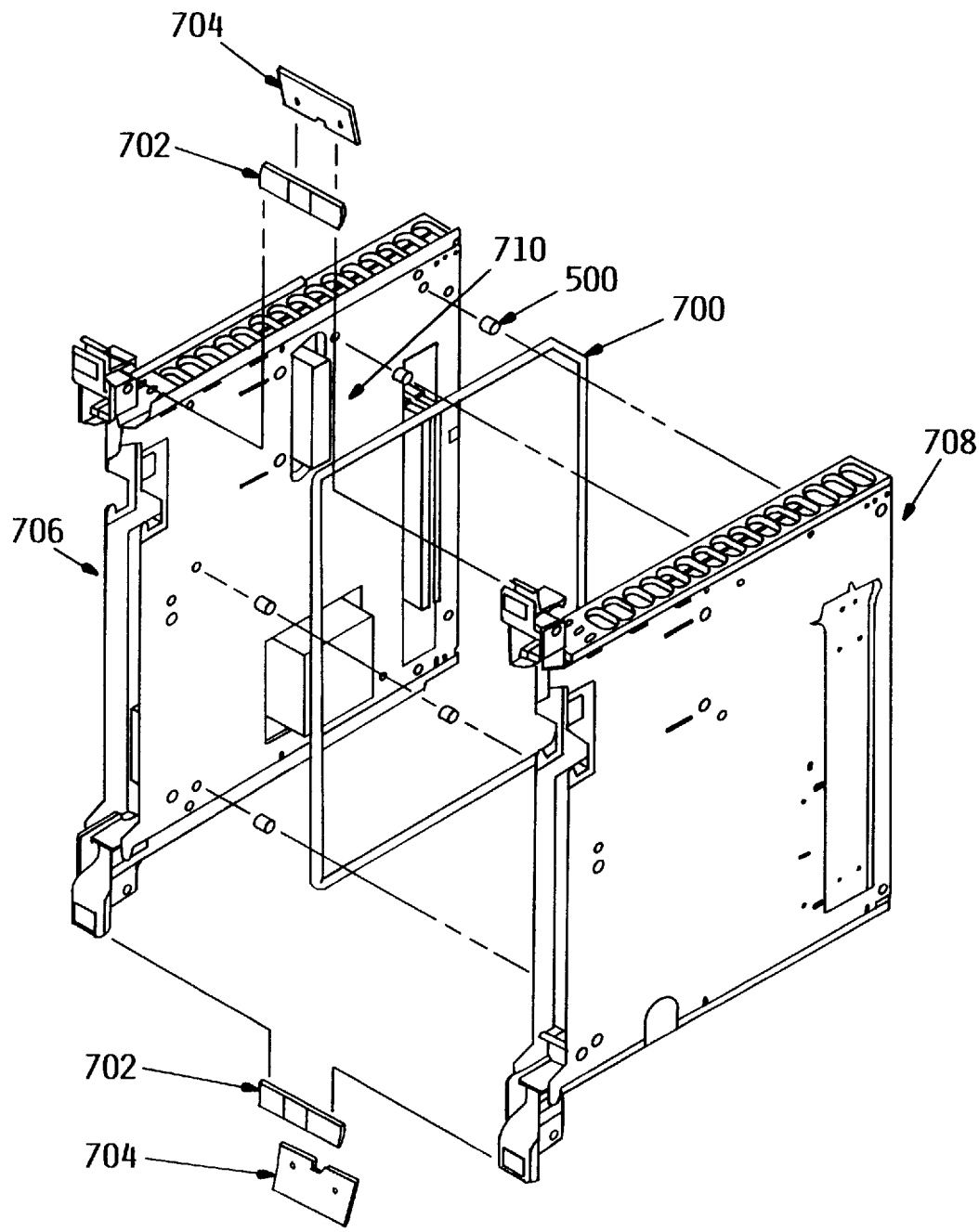
FIG. 9 is an alternate exploded view of two book packages connected exclusively of the backplane according to an embodiment of the present invention.

FIG. 9 depicts an alternative embodiment of the interconnected book package system of the present invention. A first book package 706 is connected to a second book package 708 mechanically and electrically exclusively of the backplane. The first book package 706 differs from the first book package 402 of FIG. 5 primarily in the location of the connection assembly 710 (only half of which is shown due to the angle of perspective at which FIG. 9 is drawn) being located differently; the same is true for the second book package 708 relative to the second book package 404.

FIG. 9 shows an electrically conductive gasket 700 positioned between the book packages 706 and 708 and around the connection assembly 710. Preferably, the gasket 700 is made from one piece, is flexible, and is impregnated with a metal, e.g., silver. Alternatively, the gasket 700 could be formed from several separate pieces and/or be relatively inflexible. Such an electrically conductive gasket is available from the Vanguard Products Cooperation and is marketed under the trade name of the Ultra-Vanshield brand of dual elastomer Radio Frequency Interference (RFI)/Electro Magnetic Interference (EMI) shielding gaskets. The gasket 700 has, e.g., silver particles embedded in it so that it provides ESD and EMI shielding protection for the connection assembly 710.

Figure 11:
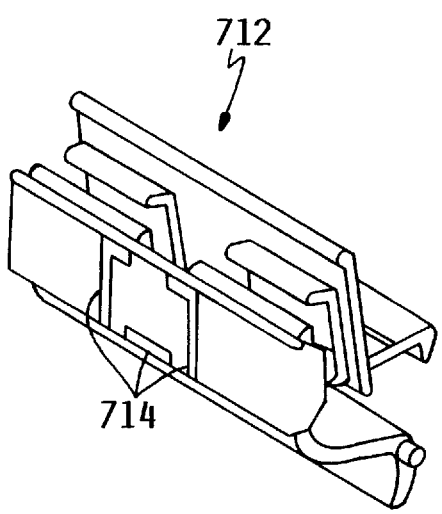
FIG. 11 is a depiction of a multi-book-package mechanical connector.

FIG. 9 also depicts an exploded view of multi-book latch assemblies; one of which is shown as a whole assembly 712 of FIG. 11.

Figure 10:
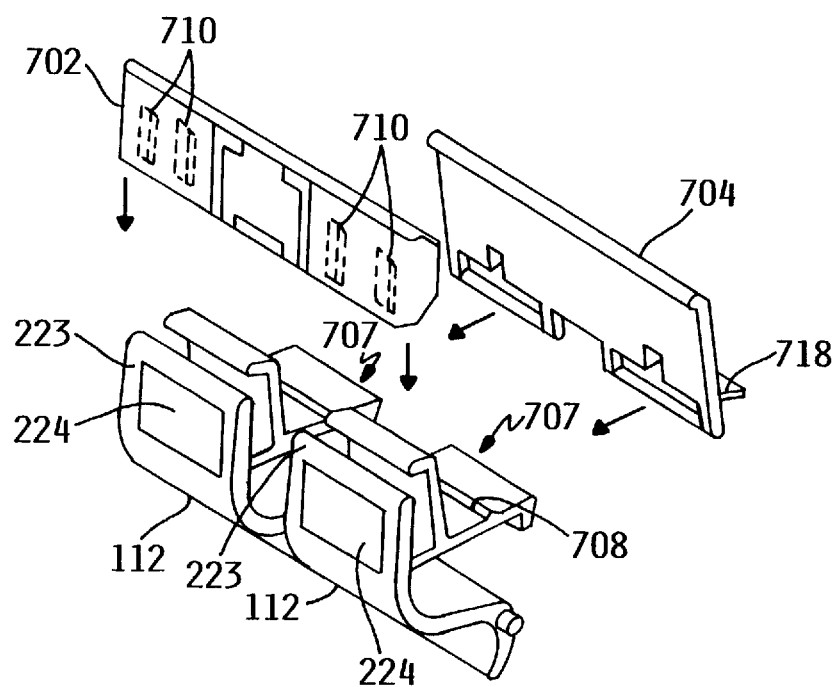
FIG. 10 is an exploded view of the inter-book-package mechanical connector of FIG. 11.
Figure 22:
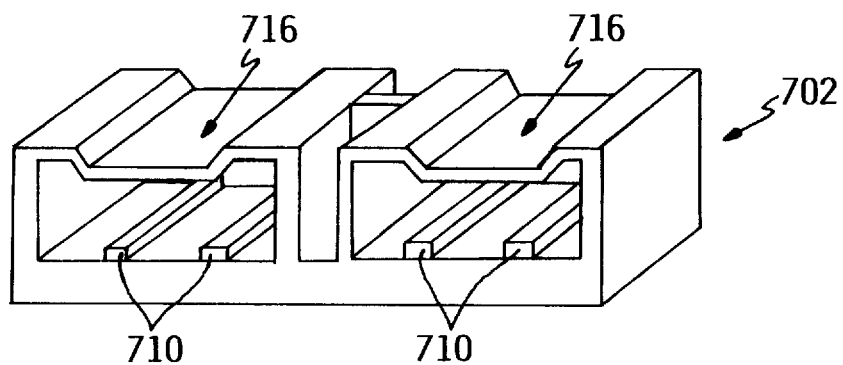
FIG. 22 is a perspective view of an upper clip of the multi-book-package connector of FIG. 11.

FIG. 10 depicts a more detailed exploded view of the latch assembly 712 of FIG. 11. Two latches 112 are mechanically connected together by an upper clip 702 having encircling portions 716 (see FIG. 22) that are slipped down over the upper portions 223 and 224 of the latches 112. Inside the surrounding structures 716 of the upper clip 702 are ribs 710 that are correspondingly sized to the recesses 224 on the upper portions 223 of the latches 112 so that when the upper clip 702 is slipped down over the latches 112, the ribs 710 engage the recesses 224 to produce a mechanical connection. In addition, the upper clip 702 has ribs 710 on the bottom thereof positioned between the latches 112. It is noted that FIG. 22 is a depiction of the upper clip 702 drawn as if looking down on the upper clip 702 from the top of FIG. 10.

Figure 23:
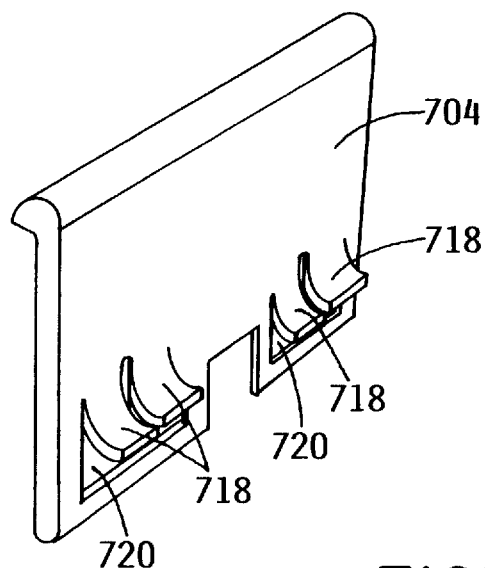
FIG. 23 is a perspective view of a lower clip of the multi-book-package connector of FIG. 11.
Figure 24:
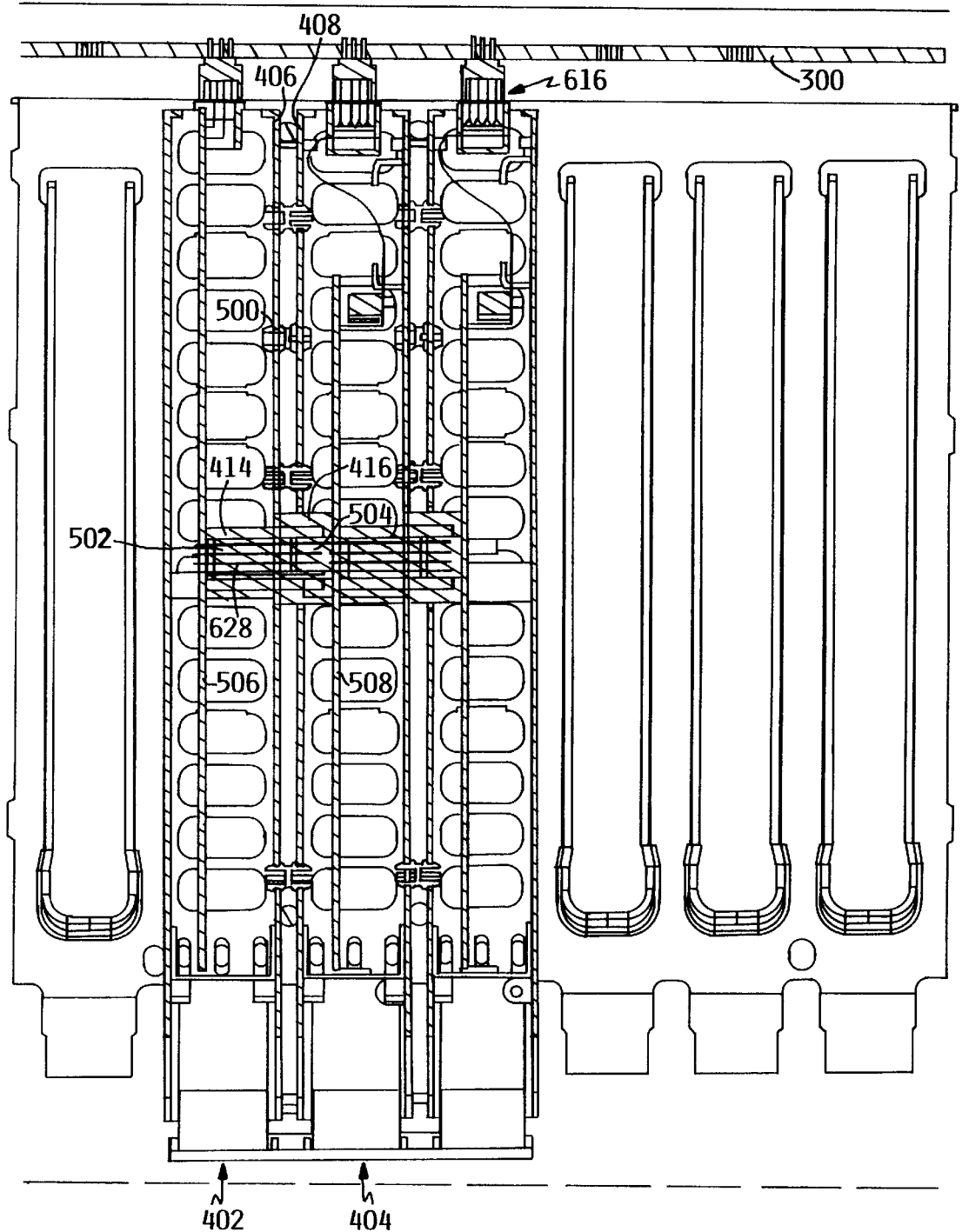
FIG. 24 is a sectional view depicting three book packages connected according to the invention, and the associated circuit boards and connectors.

FIG. 23 depicts a view of the lower clip 704 of FIG. 10, albeit from a different prospective than FIG. 10. The lower clip 704 slips over front portion 707 of the latches 112. This front portion 707 of the latch 12 has a flange 708. The front portion 707 of the latches 112 are inserted through the apertures 720 of the lower clip 704. Flanges 718 of the lower clip 704 rest against the upper surface of the front portions 707 of the latches 112 until the lower clip 704 is inserted fully onto the front portions 707 at which time the flanges 718 slip down into a recess formed by the flanges 708, which establishes the mechanical connection between the lower clip 704 and latches 112.

Figure 12:
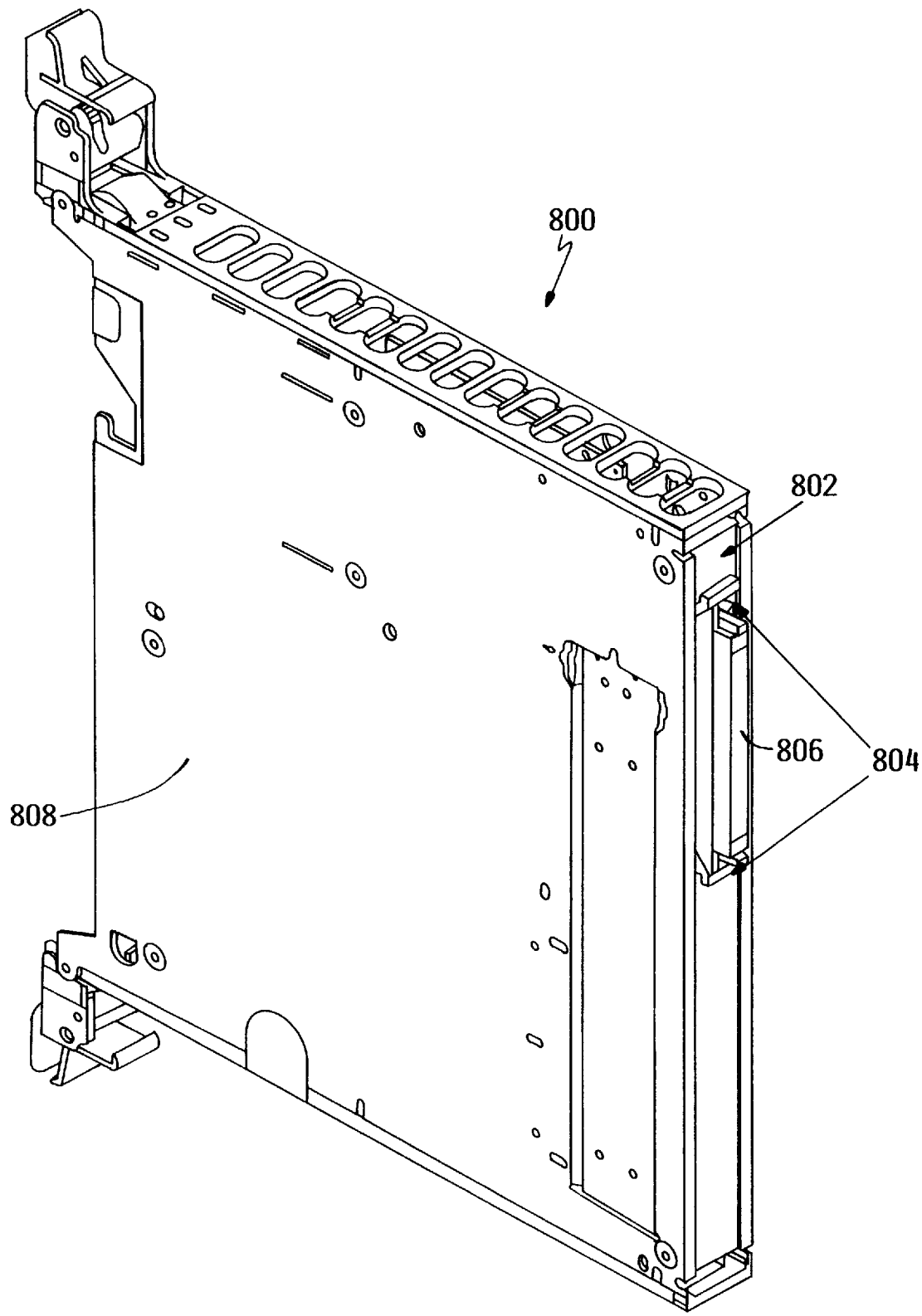
FIG. 12 is an embodiment of the adaptive package backplane connector embodiment of the present invention.

FIG. 12 depicts an adaptive pitch backplane connector embodiment of the interconnected book package system of the present invention. A backplane connector 806 is inserted into an aperture in an edge wall 802 of the book package 800 of FIG. 12. The backplane connector 806 is mechanically connected within the aperture by two plastic slide blocks 804. The aperture is wider in size than the combination of the backplane connector 806 and the slide blocks 804 such that the combination can move back and forth in a direction parallel to the plane of the edge panel 802 and perpendicular to the plane of the side cover 808, i.e., the backplane connector 806 can float. The circuit board (not shown) within the book package 800 is connected electrically to the backplane connector 806 via well known flexible conductors (not shown). A floating backplane connector, e.g., as in FIG. 12, relieves the build up of tolerance between book packages of the same pitch and permits such book packages that have been connected together to be connected to a backplane having a different pitch.

Figure 13:
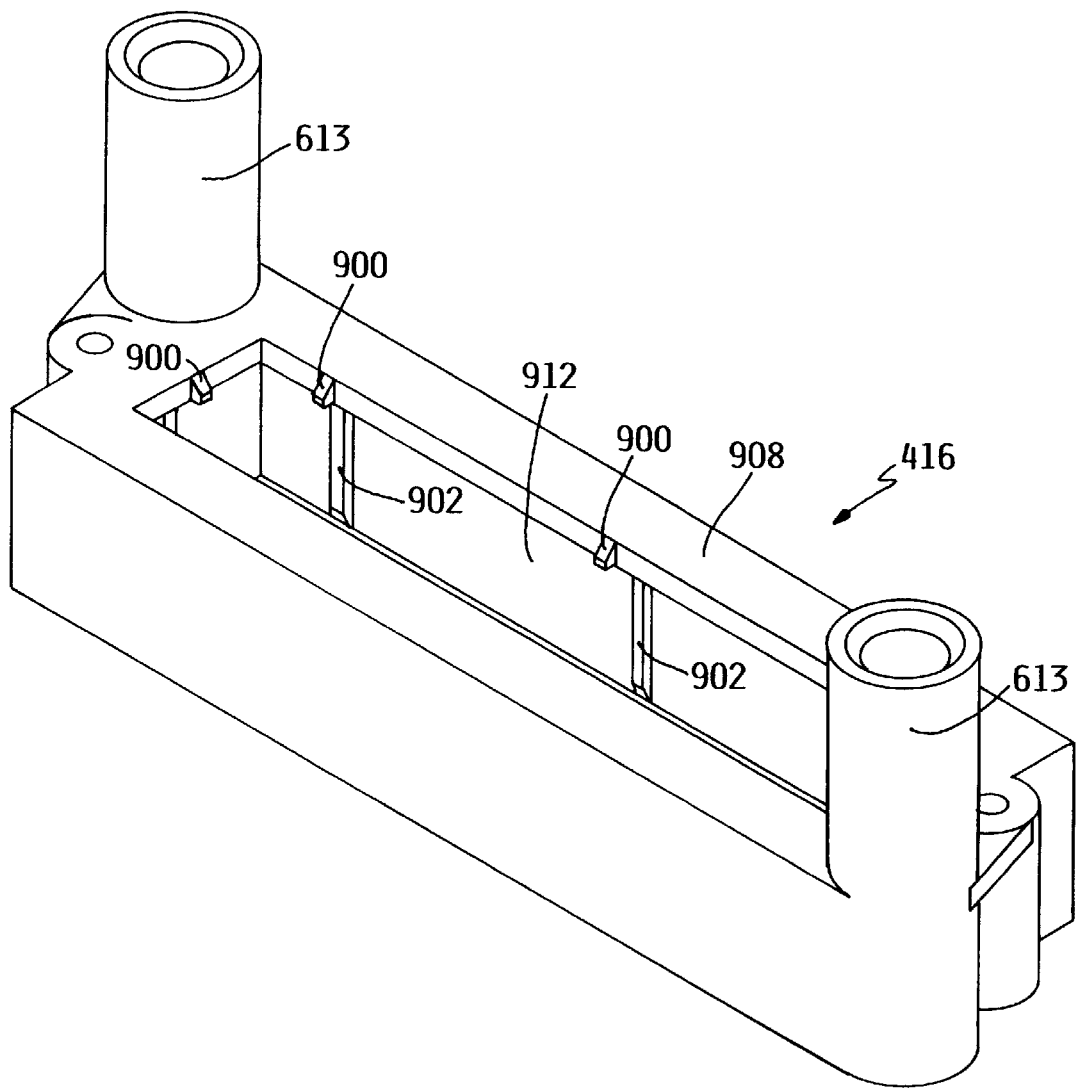
FIG. 13 is a perspective view of a female guide structure embodiment of the present invention.

FIG. 13 is an enlarged perspective depiction of the female guide structure 416. In FIG. 13, the leading end of the guide structure 416 is oriented downward. The leading end is the end into which the male guide structure is inserted. Thus, the leading end has an aperture (not shown) leading to a cavity 907 (see FIG. 15) within the female guide structure 416. In that cavity, 907 are ribs 902. The ribs 902 decrease the distance between the inside surface of the female guide structure 416 and the outside surface of the male guide structure 414. In the alternative, the side walls of the female guide structure could be made thicker so as to eliminate the need for the ribs 902. The ribs 902 confer the advantage of allowing the side walls of the guide structure 416 to be thinner, thus conserving material.

Figure 17:
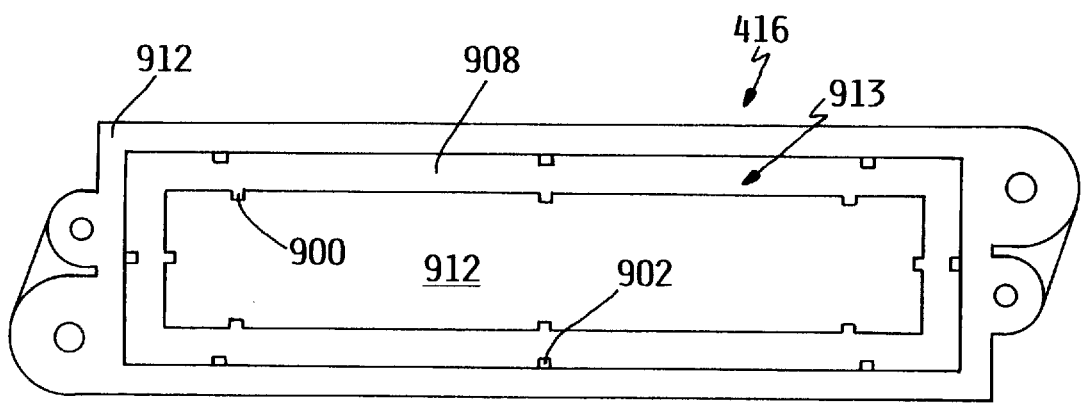
FIGS. 17 and 18 are top and bottom views, respectively, of the female guide structure of FIG. 13.

FIG. 17 depicts, opposite the aperture 913 in the leading end of the female guide structure 416, a smaller aperture 912 through which the female connector 504 is inserted. The aperture 912 has tapered ribs 900 extending thereunto. The tapered ribs 900 assist in the alignment of the female guide structure 416 as it is placed over and around the female connector 504. A face of the back wall 908 of the female guide structure 416 is positioned against the circuit board 508.

Figure 15:
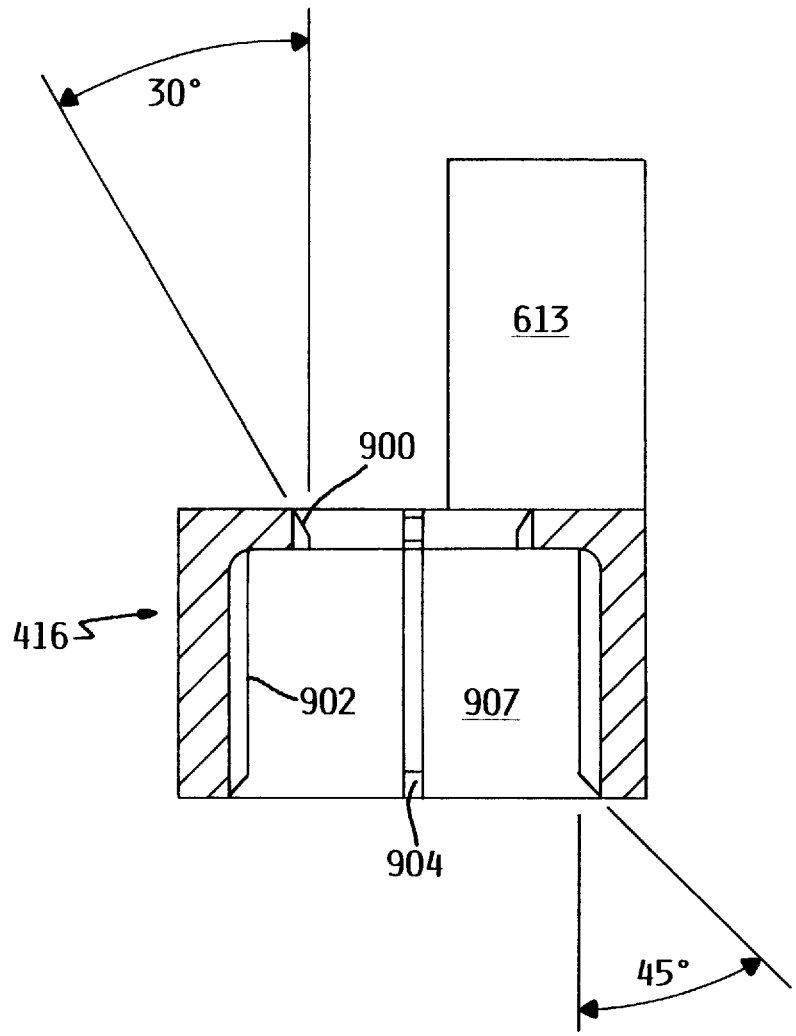
FIG. 15 is a sectional view of the female guide structure depicted in FIG. 13.

FIG. 15 depicts a sectional view of the female guide structure 416. The ribs 902 have tapered leading ends 904, tapered at an angle of about 45°. The tapered ribs 900 are tapered at an angle of about 30°.

FIG. 17 is a top view of the female connector 416 looking into the leading end. The aperture 912 is shown as being smaller than the aperture 913 at the leading end of the female guide structure 416. The aperture 912 is formed within the back wall 908. The ribs 900 and 902 are shown as determining the minimum dimensions of the apertures 912 and 913, respectively.

Figure 18:
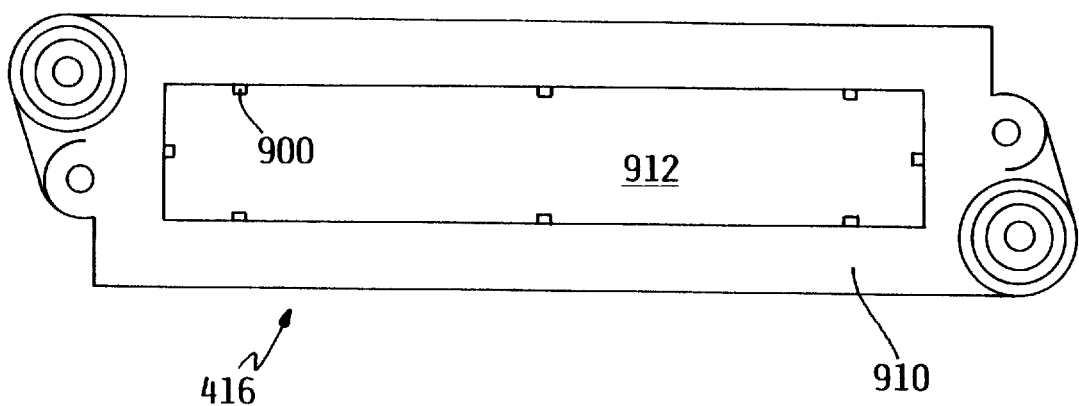

FIG. 18 is a bottom view of the female guide structure 416.

Figure 14:
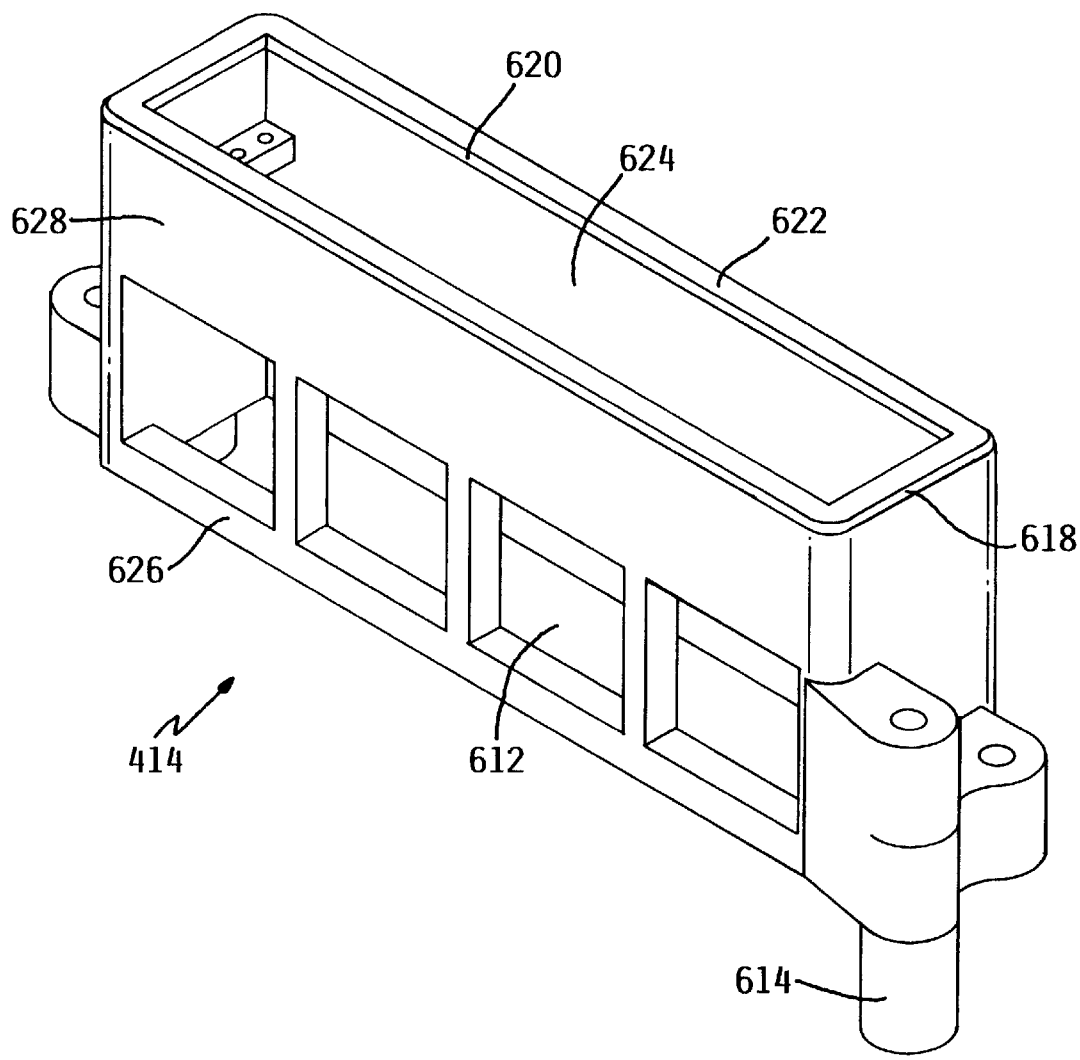
FIG. 14 is a perspective view of a male guide structure embodiment of the present invention.

FIG. 14 is an enlarged perspective depiction of the male guide structure 414. The male guide structure 414 has a cavity 624 into which is inserted the male connector 502. The forward most surface 622 of the leading end has an inner tapered edge 620 and an outer tapered edge 618. The upper side wall 628 and the lower side wall 626 have the apertures 612 formed in them.

Figure 16:
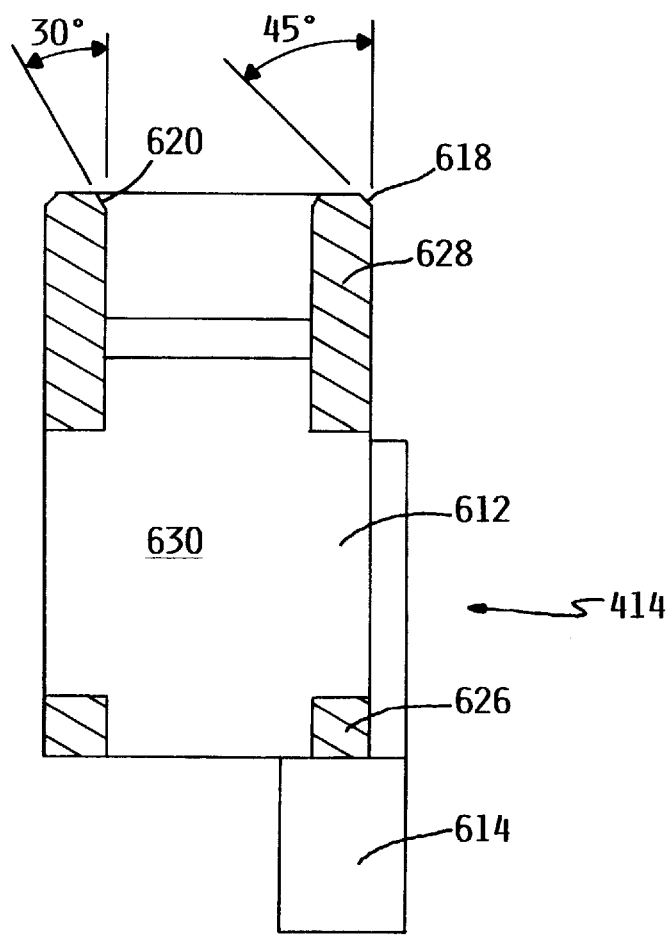
FIG. 16 is a sectional view of the male guide structure depicted in FIG. 14.

FIG. 16 is a sectional view of the male guide structure 414. The outside tapered surface 618 is tapered at an angle of 45° and the inner tapered surface 620 is tapered at an angle of 30°. An aperture 612 is positioned between the upper side wall 628 and a lower side wall 626 adjacent to the cavity 630 inside the male guide structure 414.

Figure 19:
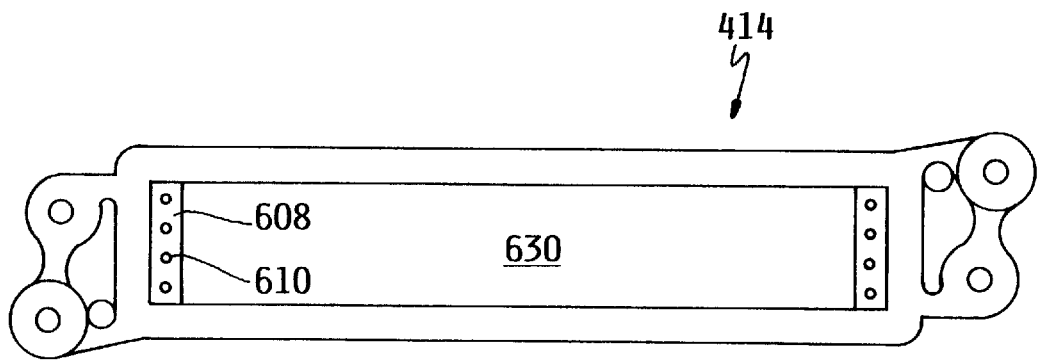
FIGS. 19 and 20 are bottom and top views, respectively, of the male guide structure of FIG. 14.
Figure 20:
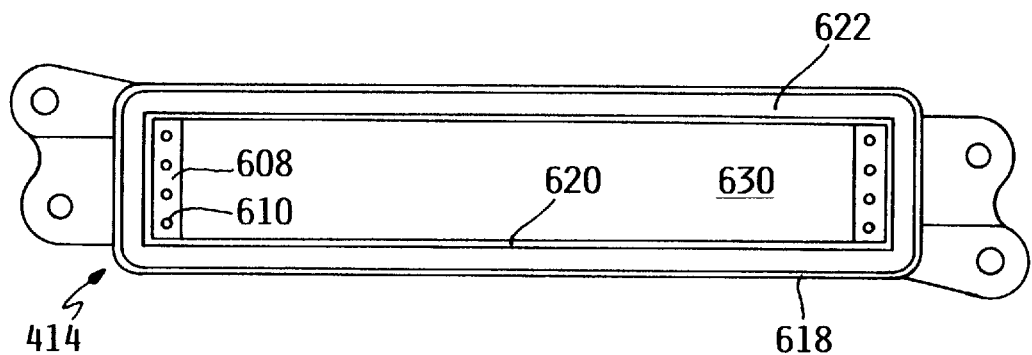

FIG. 19 is a bottom view of the male guide structure 414 showing the flanges 608 in the cavity 630 of the male guide structure 414. FIG. 20 is a top view of the male guide structure 414 showing the furthermost leading end surface 622, the adjacent inner tapered 620 and the adjacent outer tapered surface 618.

As reflected in FIGS. 6 and 9, the inter-book-package connection assembly can be located anywhere on the inner cover panels, preferably near the center. By locating the inter-book-package connection assembly near the center of the inner cover panels, the signal path length between the circuit boards can be minimized, which improves the performance of the circuit boards by decreasing the propagation times of the signals passing through the connection assembly.

The inter-book-package connection assembly, e.g., the male connector 502, the male guide structure 414, the female guide structure 416, and the female connector 502, greatly enhances the ease and reliability by which an electrical connection is made exclusively of the backplane between the circuit board 506 and the circuit board 508. Without the male guide structure 414 and the female guide structure 416, a person wishing to connect the first book package 402 to the second book package 404 would have to observe the male connector 502 going into the female connector 504 at least to the point where the tapered ends 628 of the pins 606 enter the mouth of the holes 652, i.e., the area defined by the tapered surfaces 654 of FIG. 21; this is a difficult alignment requiring patience and good hand-eye coordination.

Without using the guide structures of the present invention, and without visually aligning the male connector 502 with the female connector 504, there is a great risk in bending one or more of the pins 606 which would prevent the first circuit board 506 from being connected to the second board 508. When one considers the probable location of the insert-book-package connection as being at the center of the book package, one can understand the difficulty in visually aligning the male connector 502 with the female connector 504. Moreover, this visual alignment consumes a significant amount of time, especially when one considers the need to assembly these inter-connected-book package systems on an assembly line.

The Inventors of the present invention have recognized these visual alignment problems and have added the male guide structure and female guide structure, e.g., 414 and 416 of FIG. 6, respectively, to replace the need to visually align the male connector 502 with the female connector 504. The tapered outer leading end surface 618 and the inner tapered leading end surface 620 of the male guide structure 414 and the tapered leading ends 904 of the ribs 902 of the female guide structure 416 achieve the medium grade of alignment that would otherwise be provided by the hand-eye coordination of a person observing the position of the male connector 502 relative to the position of the female connector 504, in the absence of the use of the guide structures 414 and 416.

The coarse alignment necessary to invoke the medium grade alignment function of the guide structures is achieved by aligning the edges of the two book packages when one is positioned over the other, much as one would do when straightening or ordering a stack of paper prior to placing it into a paper bin of a printer or a photocopier. In other words, the coarse alignment is achieved by positioning the inner cover panel 406 of the first book package 402 over the inner cover panel 408 of the second book package 404. Almost simultaneously, one aligns the edge surface contour of the first book package with the edge surface contour of the second book package. As a result, the male guide structure 414 of the first book package 402 will be sufficiently coarsely aligned with the female guide structure 416 of the second book package 404 such that the guide structures 414 and 416 can achieve their medium grade alignment function.

As the leading end of the male guide structure 414 is slightly inserted into the leading end of the female guide structure 416, i.e., to a depth of no more than the depth of the bevelled/tapered surfaces 620 and 904, respectively, there is a relatively large amount of play between the male guide structure and the female guide structure. The outer dimension of the male guide structure 414, toward the leading end but prior to the taper, e.g., is 16.65±1 millimeters (mm) by 69.78±2 mm. The cavity defined by the sidewalls of the female guide structure 416, upon which the ribs 902 are formed, is 18.96±0.2 mm by 70.08±0.2 mm. This leaves about 2.5 millimeters of play, i.e., a difference in size in the smaller direction of about 2.5 millimeters and about 2 millimeters in the long direction.

There is a relatively medium amount of play between the male guide structure 414 and the female guide structure 416 over a moderate range of insertion, i.e., from the point beyond which the tapered portions of each guide structure are overlapping up until the pins 606 of the male connector 502 enter the mouths (as defined by the tapered area 654) of the hole 652 of the female connector 504. The ribs 902 of the female guide structure 416 decrease the dimensions of the cavity therein by about 1 millimeter, thereby decreasing the play in the long direction to about 0.5 millimeters and about 0.3 millimeters in the shorter direction. Thus, the decrease in play from the relatively large amount from to the relatively medium amount, for the exemplary dimensions given, is about one order of magnitude.

As the male guide structure 414 is inserted even further into the female guide structure 416, the pins 606 of the male connector 502 are inserted past the mouths of the holes 652, thereby leaving only negligible play between the pins 606 and the holes 652.

The ability of the two book packages of the interconnected book package system of the present invention to be connected without the need to have a person visually provide the medium grade alignment necessary to get the pins 606 of the connector 502 ready to go into the holes 652 without bending permits the process of connecting one book package to the other to be able to be done with one's eyes closed, i.e., blind plugging of one book package into another book package. All that is necessary is that one use one's fingers to align the edge surface contours of the two book packages with each other.

The mechanical connection between the two book packages 402 and 404 is partially achieved by the connection assembly, e.g., the male connector 502, the male guide structure 414, the female guide structure 416 and the female connector 504 as they are connected to each other and the boards 506 and 508, respectively. Also, this connection is achieved by the four cover clips 500 which secure the inner cover plate 406 to the inner cover plate 408. Lastly, the mechanical connection is formed in part by the multi-book connection assembly 712 of FIG. 11. It is noted that FIG. 11 shows the multi-book connection assembly as connecting two book packages, although the connector component 702 and 704 could be adapted to connect as many book packages as are needed to act as a unit due to plural inter-book-package connection assemblies.

The exclusive-to-the-backplane, inter-book-package connection assembly of the present invention permits intuitive connection of one book package to another. Separating such an interconnected book package system, however, is much less intuitive, perhaps even counter-intuitive. This incorporates a margin of safety in the system so that someone who should not be separating such a system has difficulty in doing so but someone who should be separating such a system, e.g., a service person, can do so quickly and with little effort.

For plural book packages 100 positioned within a chassis 302 and connected to a backplane 300, there is a predetermined pitch between the book packages, defined by the manufacturer of the backplane. Pitch is the distance between circuit boards in a direction perpendicular to the plane of the circuit boards. The floating backplane connected assembly 804 and 806 of FIG. 12 is used, e.g., with one of the two book packages in a two-book-package interconnected system to allow the book packages of different pitch manufacturers to be used together because the floating backplane connector eliminates the pitch difference. This is achieved because the floating backplane connector can absorb a pitch mismatch of about 2.5 millimeters in the direction perpendicular to the plane of the circuit boards.

For ease of illustration, the interconnected book package system of the present invention has been depicted as including two book packages, although more book packages can be so interconnected as a given application might require. In other words, two, three, or more book packages are contemplated as being connected together exclusively of the backplane according to the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. An interconnectable book package system for use in a computer having a backplane to which circuit boards housed in book packages are connectable mechanically and electrically, the system comprising:

a first book package having a first circuit board therein, the first book package being mechanically connectable to the backplane and the first circuit board being electrically connectable to the backplane;

a second book package having a second circuit board therein, the second book package being mechanically connectable to the backplane; and a blind connection assembly mechanically connecting the first book package to the second book package and electrically connecting the first circuit board to the second circuit board exclusively of the backplane, the blind connection assembly including:

a female guide structure;

a female connector positionable in the female guide structure to form a female part of the connection assembly;

a male guide potion complementarily shaped relative to the female guide structure;

a male connector complementarily shaped relative to the female connector and positionable in the male guide structure to form a male part of the connection assembly;

wherein the complementarily shaped male and female parts are formed to exhibit a gradient of play such that there is negligible play between the male connector and the female connector when the male part is fully inserted into the female part, there is a relatively medium amount of play between the male guide structure and the female guide structure over a moderate range of insertion of the male part into the female part, and there is a relatively large amount of play between the male guide structure and the female guide structure when the male part is inserted slightly into the female part.

2. The system as in claim 1, wherein the relatively large amount of play is about one order of magnitude greater than the relatively medium amount of play.

3. The system as in claim 1, further comprising:

first separation means, disposed on the first circuit board opposite to the connection assembly, for separating the first circuit board from a wall of the first book package; and second separation means, disposed on the second circuit board opposite to the connection assembly, for separating the second circuit board from a wall of the second book package.

4. The system as in claim 3, wherein:

the first separation means is formed from at least one protrusion of the connection assembly through the first circuit board; and the second separation means is formed from at least one protrusion of the connection assembly through the second circuit board.

5. The system as in claim 1, further comprising:

an electrically conductive gasket positioned between the first and second book packages about the connection assembly.

6. The system as in claim 5, wherein the gasket is flexible.

7. The system as in claim 5, wherein the gasket is continuous such that one piece thereof encircles the connection assembly.

8. The system as in claim 1, wherein the second circuit board also is electrically connectable to the backplane.

9. The system as in claim 1, wherein the connection assembly mechanically connects the first book package to the second book package by mechanically connecting the first circuit board to the second circuit board.

10. The system as in claim 1, wherein the first circuit board and the second circuit board together represent a circuit that would be too large to fit on a standard size circuit board of a standard book package.

11. The system as in claim 1, wherein:

each book package includes at least one latch mechanically connecting the book package to the backplane;

the system further comprising for each set of corresponding latches:

at least one of an upper clip and a lower clip for mechanically connecting together a latch from said first book package and a latch from said second book package such that the book packages are connectable to the backplane as a unitary body.

12. The system as in claim 11, wherein the system has both an upper and lower clip for each set of corresponding latches.

13. The system as in claim 1, further comprising:

cover clip means for mechanically connecting a face of the first book package, on which is disposed the first connecting means, to a face of the second book package on which is disposed the second connecting means.

14. The system as in claim 1, wherein the first book package includes first floating means for electrically connecting to the backplane, the first floating means being loosely physically connected to the first book package to compensate for differences in pitch between the first book package and the second book package.

15. The system as in claim 14, wherein:

the second book package is of a different pitch than the first book package;

the second circuit board also is electrically connectable to the backplane; and the second book package includes second floating means for electrically connecting to the backplane, the second floating means being loosely physically connected to the second book package to compensate for negative effects of manufacturing tolerances upon the connection of the second book package to the backplane;

at least one of the first and second floating means compensating for the difference in pitch between the first book package and the second book package.

16. The system as in claim 1, further comprising:

a third book package having a third circuit board therein, the third book package being mechanically connectable to the backplane; and a second connection assembly mechanically connecting the first book package to the third book package and electrically connecting the first circuit board to the third circuit board exclusively of the backplane.

17. An interconnectable book package system for use in a computer having a backplane to which circuit boards housed in book packages are connectable mechanically and electrically, the system comprising:

a first book package having a first circuit board therein, the first book package being mechanically connectable to the backplane and the first circuit board being electrically connectable to the backplane;

a second book package having a second circuit board therein, the second book package being mechanically connectable to the backplane;

first connecting means attached to the first book package and second connecting means attached to the second book package, each connecting means being for mechanically and electrically connecting to the other so as to mechanically connect the first book package to the second book package and electrically connect the first circuit board to the second circuit exclusively of the backplane; and blind alignment means, formed on one of the first or second connecting means, for aligning the first connecting means with the second connecting means.

18. The system as in claim 17, wherein:

the first connecting means includes a male part insertable into a complimentarily formed female part of the second connecting means; and the blind alignment means is formed on the first connecting means and includes a beveled surface on a leading end of the male part.

19. The system as in claim 18, wherein the alignment means is a first alignment means, the system further comprising:

second blind alignment means, formed on the second connecting means, for aligning the first connecting means with the second connecting means, the second blind alignment means including a beveled surface on a leading end of the female part.

20. The system as in claim 17, wherein:

the first connecting means includes a female part for use in receiving a complimentarily formed male part of the first connecting means;

the blind alignment means includes a beveled surface on a leading end of the female part.

21. The system as in claim 17, wherein the second circuit board also is electrically connectable to the backplane.

22. The system as in claim 17, wherein the first connection means is attached to the first book package by being attached to the first circuit board, the second connection means is attached to the second book package by being attached to the second circuit board.

23. The system as in claim 17, wherein the first circuit board and the second circuit board together represent a circuit that would be too large to fit on a standard size circuit board of a standard book package.

24. The system as in claim 17, wherein:
   each book package includes at least one latch mechanically connecting the book package to the backplane;
   the system further comprising for each set of corresponding latches:
      at least one of an upper clip and a lower clip mechanically connecting together a latch from said first book package and a latch from said second book package the set of corresponding latches of the book packages such that the book packages are connectable to the backplane as a unitary body.

25. The system as in claim 24, wherein the system has both an upper and lower clip for each set of corresponding latches.

26. The system as in claim 17, further comprising:
   at least one cover clip mechanically connecting a face of the first book package, on which is disposed the first connecting means, to a face of the second book package on which is disposed the second connecting means.

27. The system as in claim 17, further comprising:
   an electrically conductive gasket positioned between the first and second book packages about the first and second connecting means.

28. The system as in claim 27, wherein the gasket is flexible and continuous such that one piece thereof encircles the first and second connecting means.

29. A method of blindly connecting a first book package to a second book package, the first and second book packages each having a circuit board housed therein and having an edge surface perpendicular to the plane of the circuit board therein, respectively, the first book package having a first connecting means and the second book package having a second connecting means, each connecting means being for mechanically and electrically connecting to the other so as to mechanically connect the first book package to the second book package and electrically connect the first circuit board to the second circuit exclusively of a backplane of a computer in which the first and second book packages are to be used, the first connecting means and the second connecting means cooperating to exhibit a gradient of play of about one order of magnitude, the method comprising the steps of:
   positioning a face of the first book package, on which is disposed the first connecting means, over a face of the second book package on which is disposed the second connecting means;
   blindly aligning an edge surface contour of the first book package with an edge surface contour of the second book package such that the first connecting means aligns with the second connecting means without having to observe the position of the first connecting means relative to the position of the second connecting means; and
   blindly inserting one of the first and second connecting means into the other of the first and second connecting means, without having to observe the position of the first connecting means relative to the position of the second connecting means, to mechanically connect the first book package to the second book package while electrically connecting the first circuit board to the second circuit board exclusively of the backplane.

30. The method as in claim 29, further comprising:
   placing an electrically conductive gasket between the first and second book packages about the connection assembly.

31. The method as in claim 29, wherein the step of inserting includes mechanically connecting the first book package to the second book package by mechanically connecting the first circuit board to the second circuit board.

32. The method as in claim 29, further comprising:
   mechanically connecting a face of the first book package, on which is disposed the first connecting means, to a face of the second book package on which is disposed the second connecting means.

33. An interconnectable book package system for use in a computer having a backplane to which circuit boards housed in book packages are connectable mechanically and electrically, the system comprising:
   a first book package having a first circuit board therein, the first book package being mechanically connectable to the backplane and the first circuit board being electrically connectable to the backplane;
   a second book package having a second circuit board therein, the second book package being mechanically connectable to the backplane;
   a connection assembly mechanically connecting the first book package to the second book package and electrically connecting the first circuit board to the second circuit board exclusively of the backplane; and
   an electrically conductive gasket positioned between the first and second book packages about the connection assembly.

34. An interconnectable book package system for use in a computer having a backplane to which circuit boards housed in book packages are connectable mechanically and electrically, the system comprising:
   a first book package having a first circuit board therein, the first book package being electrically connectable to the backplane, and the first book package including at least one latch for mechanically connecting the first book package to the backplane;
   a second book package having a second circuit board therein, the second book package including at least one latch for mechanically connecting the second book package to the backplane;
   a connection assembly mechanically connecting the first book package to the second book package and electrically connecting the first circuit board to the second circuit board exclusively of the backplane; and
   at least one of an upper clip and a lower clip for mechanically connecting together a latch from said first package and a latch from said second book package such that the book packages are connectable to the backplane as a unitary body.

35. The system as in claim 34, wherein the each book package has two latches and the system has both an upper and lower clip for each set of corresponding latches.

36. An interconnectable book package system for use in a computer having a backplane to which circuit boards housed in book packages are connectable mechanically and electrically, the system comprising:
   a first book package having a first circuit board therein, the first book package being mechanically connectable to the backplane and the first circuit board being electrically connectable to the backplane;
   a second book package having a second circuit board therein, the second book package being mechanically connectable to the backplane;

a connection assembly mechanically connecting the first book package to the second book package and electrically connecting the first circuit board to the second circuit board exclusively of the backplane; and cover clip means for mechanically connecting a face of the first book package, on which is disposed the first connecting means, to a face of the second book package on which is disposed the second connecting means.

37. An interconnectable book package system for use in a computer having a backplane to which circuit boards housed in book packages are connectable mechanically and electrically, the system comprising:

a first book package having a first circuit board therein, the first book package being mechanically connectable to the backplane and the first circuit board being electrically connectable to the backplane;

a second book package having a second circuit board therein, the second book package being mechanically connectable to the backplane; and a connection assembly mechanically connecting the first book package to the second book package and electrically connecting the first circuit board to the second circuit board exclusively of the backplane;

wherein the first book package includes floating means for electrically connecting to the backplane, the floating means being loosely physically connected to the first book package to compensate for differences in pitch between said first book package and said second book package.

* * * * *